United States Patent [19]

Nakamura et al.

[11] Patent Number: 4,798,650
[45] Date of Patent: Jan. 17, 1989

[54] METHOD OF DRY ETCHING ALUMINUM

[75] Inventors: Moritaka Nakamura, Yokohama; Takashi Kurimoto, Kawasaki, both of Japan

[73] Assignee: Fujitsu Limited, Kawasaki, Japan

[21] Appl. No.: 174,348

[22] Filed: Mar. 28, 1988

[30] Foreign Application Priority Data

Mar. 27, 1987 [JP] Japan ................. 62-071737

[51] Int. Cl.⁴ .............. C23F 1/02; B44C 1/22; C03C 15/00; C03C 25/06
[52] U.S. Cl. .................. 156/643; 156/646; 156/656; 156/659.1; 156/665; 156/345; 204/192.35
[58] Field of Search ............ 156/643, 646, 656, 659.1, 156/665, 345, 657, 662; 204/192.3, 192.32, 192.34, 192.35, 298; 427/38, 39; 252/79.1

[56] References Cited

U.S. PATENT DOCUMENTS 4,384,918  5/1983  Naomichi ................. 156/643

FOREIGN PATENT DOCUMENTS 57-44747   9/1982  Japan.
61-59658  12/1986  Japan.

Primary Examiner—William A. Powell
Attorney, Agent, or Firm—Staas & Halsey

[57] ABSTRACT

A method of reactive ion etching (RIE) of aluminum or an alloy thereof (Al) in which a substrate with an Al layer coated thereon is maintained at a temperature of 60° C. or less by cooling the substrate, so that the Al layer is taperingly etched to form conductor lines having sloped sidewalls. The substrate is clamped to a cooled electrode stage by an electrostatic chuck.

5 Claims, 2 Drawing Sheets

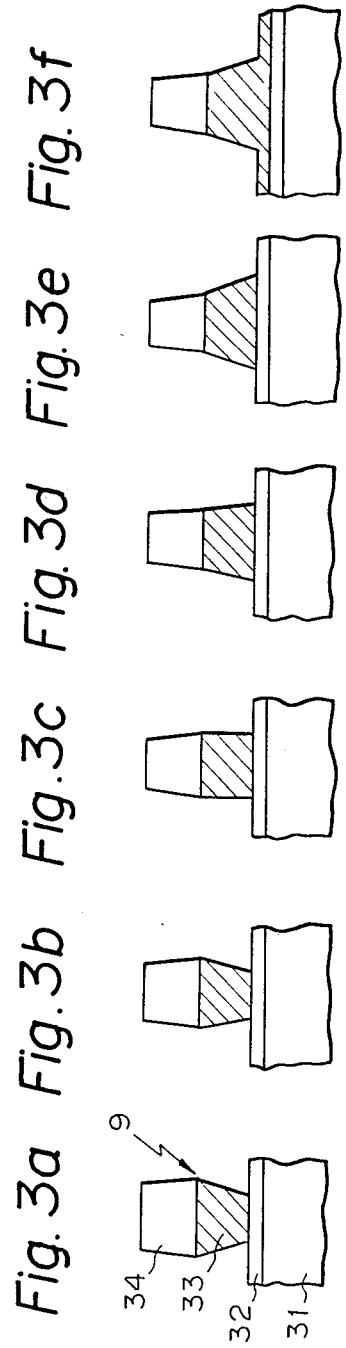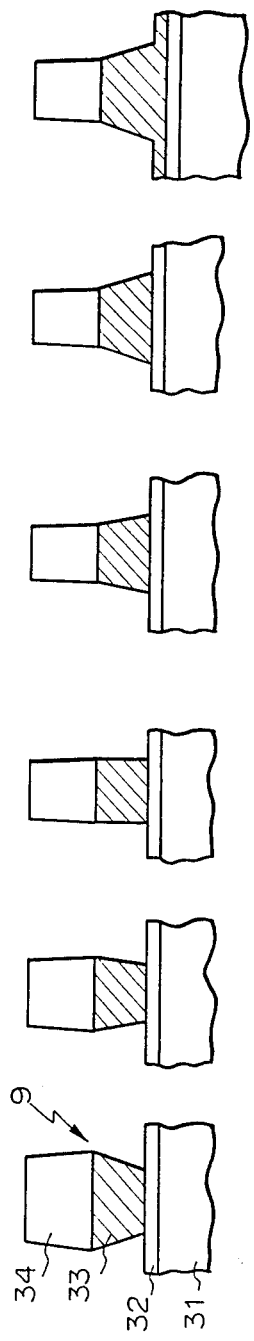

METHOD OF DRY ETCHING ALUMINUM

BACKGROUND OF THE INVENTION

1. Field of the Invention

The present invention relates to a dry etching method, and more particularly, to a method of reactive ion etching (RIE) of aluminum or aluminum alloy conductor lines (wiring pattern) of a semiconductor device.

2. Description of the Related Art

In the production of a semiconductor device (LSI etc.), dry etching methods are adopted because of their superiority to wet etching methods with regard to selectivity, fine pattern formability, controllability, cleanability, and the like. In particular, taking productivity and the anisotropic etching into consideration, a reactive ion etching system is widely used.

The density (integration degree) of semiconductor devices has been greatly increased, and the conductor lines of aluminum or aluminum alloy (hereinafter Al) are formed in finer patterns. Namely, the width of an Al conductor line is reduced and a distance between each the Al conductor line is also reduced. Where an Al layer is selectively etched (i.e., patterned) by an RIE method, usually a sidewall of an Al conductor line has an angle (slope angle) of approximately 90° (vertical) to a groundwork surface. Then, when an insulating layer of PSG or the like is formed, in order to cover the Al conductor lines, the surface unevenness of the insulating layer becomes larger, which causes step coverage defects of upper conductor lines formed on the uneven surface, i.e., crack in the insulating layer at corners bounded by the sidewall and the groundwork surface, and voids in the insulating layer at the narrow space between the Al conductor lines. These defects shorten the lifetime of the semiconductor device. Accordingly, problems arise with regard to the insulating layer between conductor patterns. A solution to the problem was proposed in which a method of taperingly etching an Al layer for the Al conductor lines having sloped sidewalls was adopted.

Two conventional taper etching methods are most widely used, i.e., a proportion of an etch rate of the Al to that of a mask pattern resist (a selectivity of Al over resist) is decreased, so that the mask dimensions are gradually made smaller by etching, with the result that the sloped sidewalls of the Al conductor lines are formed (for example, cf. Japanese Examined Patent Publication (Kokoku) No. 61-59658), or a carbon-containing gas such as $C_2H_2$ or $CHCl_3$ generating a deposit on the Al sidewall is added to an etching gas, to form the sloped sidewalls, for example, cf. News review "Vacuum Magnetron RIE Apparatus Able to Dig Groove at High Speed and to Perform Taper Etching of Al", Nikkei Microdevice, February, 1987, pp. 148-149).

However, in the former taper etching method, since an Al layer for Al conductor lines has an uneven surface due to a groundwork uneven surface, the thickness of the mask pattern resist is not constant. Thus a thin portion of the resist is made smaller at a faster rate than that of a thick portion, so that an undesirable overetching of Al conductor lines covered with the thin portion occurs, and breakage of the Al conductor lines may occur. In the latter taper etching method, the deposit is formed on a chamber wall, electrodes and the like, and the deposit is then peeled off to form a contaminant. These problems prevent any improvement in the LSI production yield.

During the RIE of Al, the bombardment of active radicals and ions generated in a plasma and the exothermic reaction of chlorine (Cl) with aluminum, raise the temperature of a substrate (e.g., wafer). Accordingly, at a high rf power and/or a high etch rate, the substrate temperature becomes too high and chars the mask pattern resist, and an abnormal reaction occurs in the substrate. To prevent this charring and abnormal reaction, usually the substrate is placed on a water cooled stage and the RIE is performed while the substrate is cooled. Under these conditions, the contact between the substrate and the cooled stage is small, and therefore, a sufficient heat transfer is not carried out, with the result that the substrate temperature rises during the etching. When the substrate temperature was measured during the RIE of Al, using a non-contact thermometer (a fluorescence optical fiber thermometer), the following results were obtained. Where many substrates were simultaneously subjected to the etching treatment (in which the loading effect decreased the etching rate and rf power density), the substrate temperature became 100° C. or more, and where the substrates are subjected to the etching treatment one by one, the substrate temperature became 130° C. or more. Under these conditions the Al was etched in a vertical direction or in an inverse taper. Therefore, to realize a taper etching, a decrease of the selectivity of the Al over resist or the addition of a carbon-containing gas must be adopted, as explained hereinabove.

According to the principle of fluorescence optical fiber thermometry, a small amount of phosphor is coated on the back of the substrate, an excitation light is applied to the phosphor through an optical fiber, fluorescence of the phosphor is observed through the fiber, and the fluorescent decay time is measured to determine the substrate temperature. In this way, the temperature can be easily measured without the problem of disturbance of the process.

SUMMARY OF THE INVENTION

An object of the present invention is to provide a method of taper etching of Al different from the conventional taper etching methods to avoid the above-mentioned problems.

Another object of the present invention is to improve a method of an RIE of Al.

Still another object of the present invention is to improve the reliability, the production yield, and the productivity of semiconductor devices.

These and other objects of the present invention are attained by providing a method of reactive ion etching of aluminum or an aluminum alloy wherein a substrate having an aluminum or aluminum alloy layer is maintained at a temperature of 60° C. or less by cooling the substrate during the etching, so that the layer is taperingly etched to form conductor lines having sloped sidewalls. Preferably, the substrate temperature is from 30° to 60° C.

Where the heat transfer between the substrate and the stage is improved to increase the cooling efficiency of the substrate maintained at a temperature of 60° C. or less, the taper etching is attained without changing the selectivity of Al over resist or adding the carbon-containing gas.

To cool the substrate, preferably the substrate is clamped to a cooled electrode (i.e., stage) of an RIE apparatus by an electrostatic chuck (for example, as disclosed in Japanese Examined Patent Publication No. 57-44747). The degree of contact between the substrate and the electrostatic chuck, as a direct stage, can be controlled by varying a voltage across a pair of electrodes in the electrostatic chuck. Since the electrostatic chuck is cooled by the cooled electrode (stage), the heat of the substrate is transferred to the cooled electrode through the electrostatic chuck. Therefore, the degree of contact is controlled and thus the substrate temperature is controlled. It is possible to control the substrate temperature by varying the coolant (water) temperature circulated in the cooled electrode (stage), as long as the electrostatic chuck is operated at a constant voltage. Furthermore, a suitable means may be adopted for the substrate temperature control.

BRIEF DESCRIPTION OF THE DRAWINGS

The present invention will be more apparent from the description of the preferable embodiments set forth below, with reference to the accompanying drawings, in which:

FIGS. 3a to 3f are sectional views of an Al conductor line under various conditions according to a voltage applied to an electrostatic chuck; and, FIGS. 4a to 4f are sectional views of an Al conductor line under various conditions according to a temperature of the cooled electrode stage.

DESCRIPTION OF THE PREFERRED EMBODIMENTS

Figure 1:
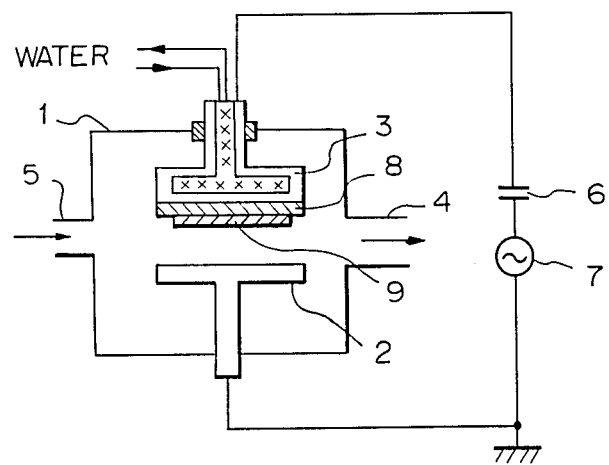
FIG. 1 is a schematic view of an RIE apparatus.
Figure 2:
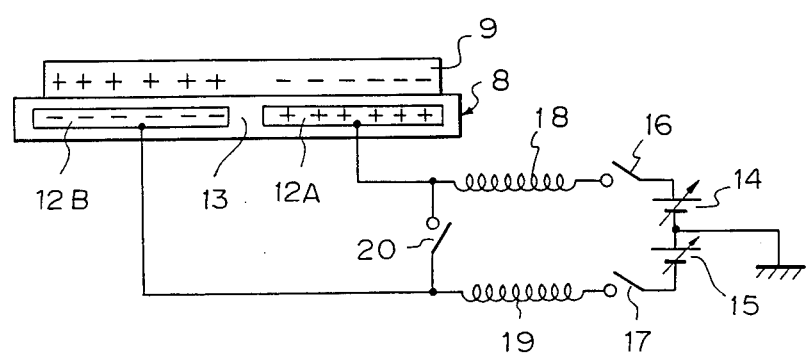
FIG. 2 is a schematic sectional view of an electrostatic chuck and a wiring diagram for the chuck.

As illustrated in FIG. 1, an RIE apparatus is a parallel-plate system type apparatus provided with an electrostatic chuck shown in FIG. 2. The structure of the RIE apparatus is basically the same as that of an apparatus disclosed in Japanese Examined Patent Publication No. 57-44747. The RIE apparatus comprises an etching chamber 1, an anode electrode 2, and a cathode electrode 3 as a water cooled stage, which electrodes are arranged facing each other within the chamber 1. The etching chamber 1 is evacuated by a vacuum pump (not shown) through an exhaust pipe 4 to produce a vacuum, and a reactant gas (an etching gas) is flowed into the chamber 1 through an inlet pipe 5. The anode 2 is grounded and the water cooled stage (cathode) 3 is connected to an rf (radio frequency) power 7 through a condenser 6. The electrostatic chuck 8 is set on the water cooled stage 3, and holds (attracts) a substrate (wafer) 9 with an Al coating layer to be etched. The substrate 9 is clamped upside down, as shown in FIG. 1, which contributes to a prevention of contaminant adhesion.

As illustrated in FIG. 2, the electrostatic chuck 8 comprises an insulating plate 13 in which a pair of plate electrodes 12A and 12B are buried. A positive potential and a negative potential from a variable DC power 14 is applied to the electrodes 12A and 12B through power switches 16 and 17 and choke coils 18 and 19, respectively, so that the chuck 8 electrostatically attracts the substrate 9, as shown in FIG. 2. A leak switch 20 is provided and is used for removing electric charges accumulated in the electrodes 12A and 12B.

EXAMPLE 1

The electrostatic chuck 8 was made by using a silicone resin for the insulating plate material 13, as shown in FIG. 2. The chuck 8 was set on an upper cathode electrode (i.e., a water cooled stage) 3 having a diameter of 180 mm, of the RIE apparatus (FIG. 1). Many substrates having an Al layer were prepared in the following manner. A silicon (Si) wafer 31 having a diameter of 6 inches and a thickness of 650 $\mu$m was thermally oxidized to form an $SiO_2$ layer 32 having a thickness of 100 nm, and an Al-Si (1%) alloy layer 33 having a thickness of 1.0 $\mu$m was formed on the $SiO_2$ layer 32 by a sputtering method, as shown in FIG. 3a and FIG. 4a. The Al-Si alloy layer 33 was coated with a resist (TSMR 8800 produced by Tokyo Oka Co.) to form a resist layer 34 having a thickness of 1.6 $\mu$m. The resist layer 34 was pre-baked, exposed, developed, and post-baked at a temperature of 110° C. to form a resist mask having a conductor line pattern.

The substrate 9 was attracted to the electrostatic chuck 8 eet on the cooled upper electrode stage 3, as shown in FIG. 1, and after the etching chamber 3 was evacuated, a mixed gas of $BCl_3$, $SiCl_4$, and $Cl_2$ was fed as an etching gas into the chamber 3, and the inside pressure of the chamber was kept at 0.12 Torr. Then an rf power of 350W (1.38 w/cm$^2$) having a frequency of 13.56 MHz was applied to the electrode 3 of the RIE apparatus to generate a plasma. In the plasma, radicals and ions of the etching gas were generated to selectively etch the Al-Si alloy layer. The cooled electrode stage 3 was maintained at a constant temperature of 30° C., and the voltage applied to the electrostatic chuck 8 (a positive potential was applied to the plate electrode 12A and a negative potential to the other plate electrode 12B) was varied to $\pm 0.5$ kV, $\pm 0.8$ kV, $\pm 1.1$ kV, $\pm 1.5$ kV, $\pm 2.0$ kV, and $\pm 2.5$ kV, and the RIE of the Al-Si alloy was carried out under the above-mentioned conditions. The temperature of the substrate 9 was measured by a fluorescence optical fiber thermometer during each RIE treatment, and the sectional shape of an Al-Si conductor line formed by the RIE was observed by a scanning electron microscope (SEM). The results are shown in Table 1 and FIGS. 3a to 3f.

TABLE 1

| APPLIED VOLTAGE (kV) | $\pm 0.5$ | $\pm 0.8$ | $\pm 1.1$ | $\pm 1.5$ | $\pm 2.0$ | $\pm 2.5$ |
|---|---|---|---|---|---|---|
| SUBSTRATE TEMP. (°C.) | 105 | 82 | 62 | 57 | 52 | 40 |
| Figure | 3a | 3b | 3c | 3d | 3e | 3f |

As is clear from these results, at an applied voltage of $\pm 0.8$ eV or less and a substrate temperature of 82° C. or more, the Al-Si alloy layers are reverse-taperingly etched (FIGS. 3a and 3b); at $\pm 1.1$ kV and 62° C., the layer is vertically etched (FIG. 3c); and, at 2.5 kV or more and 40° C. or less, the layer is insufficiently etched and a portion of the layer remains (FIG. 3f). The conductor lines formed in these cases are undesirable. At the applied voltage of from $\pm 1.5$ kV to $\pm 2.0$ kV and the substrate temperature of 57° C. to 52° C., the Al-Si alloy layers are taperingly etched (FIGS. 3d and 3e), so that desirable sloped sidewalls are formed.

Where an Al-Si (1%)—Cu (2%) alloy was used instead of the Al-Si alloy, results similar to the above-mentioned results were obtained.

EXAMPLE 2

The electrostatic chuck 8 was made by using an alumina series ceramic for the insulating plate material 13, as shown in FIG. 2, instead of the silicone resin used in Example 1. As the ceramic does not have the elasticity of silicone resin, the ceramic electrostatic chuck 8 attracted the substrate 9 with a smaller degree of contact than in Example 1. Then, to ensure a transfer of heat from the substrate 9 to the chuck 8, the gap between the substrate and chuck was filled with a helium (He) gas as a heat transfer medium. In this case, a small through hole (not shown) was formed in the chuck 8 and the helium gas flowed therethrough at the gas pressure not exceeding the attraction force of the electrostatic chuck 8. The chuck 8 was set on the cathode electrode (i.e., the water cooled stage) 3 having a diameter of 240 mm, as shown in FIG. 1. The substrate 31 with the $SiO_2$ layer 32, the AlSi alloy layer 33, and the resist mask 34 produced in Example 1, was attracted by the ceramic electrostatic chuck 8.

After the etching chamber 3 was evacuated, a mixture of $SiCl_4$ and $Cl_2$ was fed as an etching gas into the chamber 3, and the inside pressure of the chamber 3 was kept at 0.1 Torr. An rf power of 600W (1.33 w/cm$^2$) having a frequency of 13.56 MHz was applied to generate a plasma in the chamber 3. In the plasma, radicals and ions of the etching gas were generated to selectively etch the Al-Si alloy layer. The voltage applied to the electrostatic chuck 9 was fixed at ±1.5 kV and the He gas having a pressure of 10 Torr filled the gap between the substrate 9 and the chuck 8 (in practice, a small amount of the He gas flowed out), and the temperature of the cooled electrode stage 3 was varied by changing the cooling water temperature at each RIE treatment. The RIE of Al-Si alloy was carried out under the above-mentioned conditions, during which the substrate temperature was measured in the same manner as in Example 1. After the RIE, the sectional shape of the obtained Al-Si conductor line was observed by SEM. The results are shown in Table 2 and FIGS. 4a to 4f.

TABLE 2

| ELECTRODE STAGE TEMP. (°C.) | 90 | 60 | 40 | 30 | 20 | 10 |
|---|---|---|---|---|---|---|
| SUBSTRATE TEMP. (°C.) | 105 | 82 | 62 | 52 | 43 | 28 |
| Figure | 4a | 4b | 4c | 4d | 4e | 4f |

As is clear from these results, at a temperature of the cooled electrode stage 3 of 60° C. or more and a substrate temperature of 82° C. or more, the Al-Si alloy layer is reverse-taperingly etched (FIGS. 4a and 4b); at a stage temperature of 40° C. and a substrate temperature of 62° C., the layer is vertically etched (FIG. 4c); and, at a stage temperature of 10° C. or less and a substrate temperature of 28° C. or less, the layer is insufficiently etched and a portion of the layer remains (FIG. 4f). The conductor lines formed in these cases are undesirable. At a stage temperature of 30° C. to 20° C. and a substrate temperature of 52° C. to 43° C., the Al-Si alloy layers are taperingly etched (FIGS. 4d and 4e), so that desirable sloped sidewalls are formed.

Where the cooled electrode stage was maintained at a constant temperature of 30° C. and the temperature was not varied, and the cooling efficiency of the He gas heat transfer medium was varied by changing the He gas pressure, results similar to the above results were obtained.

In FIGS. 3f and 4f, as the substrate temperature falls, an amount of carbon contained in the resist and adhered on the exposed surface of the Al-Si alloy layer is increased and $AlCl_3$ or $Al_2Cl_6$ formed by a reaction of Al with Cl or $Cl_2$ is not easily volatized. This prevents a complete etching of the Al-Si alloy layer.

As mentioned above, the substrate (wafer) temperature is controlled at 60° C. or less, which is lower than in the conventional methods, during the RIE of Al, whereby a tapered etching of Al can be carried out using a usual etching gas and without a decrease of the selectivity of the Al over resist. Compared with a conventional taper etching method using an additive gas forming a deposit, in the RIE method according to the present invention, as the contaminant is decreased the product yield is improved, and the number of times of cleaning of the etching chamber is reduced, and the productivity is increased.

It will be obvious that the present invention is not restricted to the above-mentioned embodiments and that many variations are possible for persons skilled in the art without departing from the scope of the invention.

We claim:

1. A method of reactive ion etching of aluminum or aluminum alloy characterized in that a substrate having an aluminum or aluminum alloy layer is maintained at a temperature of 60° C. or less by cooling the substrate during etching, so that said layer is taperingly etched to form conductor lines having sloped sidewalls.

2. A method according to claim 1, wherein said substrate temperature is within a range of from 30° to 60° C.

3. A method according to claim 1, wherein said substrate is clamped to a cooled electrode stage by an electrostatic chuck in a reactive ion etching apparatus.

4. A method according to claim 3, wherein said electrode stage is a water cooled electrode.

5. A method according to claim 1, wherein a chlorine-containing gas is used as an etchant gas.

* * * * *

UNITED STATES PATENT AND TRADEMARK OFFICE
CERTIFICATE OF CORRECTION

PATENT NO. : 4,798,650

DATED : January 17, 1989

INVENTOR(S) : Moritaka NAKAMURA et al.

It is certified that error appears in the above-identified patent and that said Letters Patent is hereby corrected as shown below:

Col. 4, line 23, change "eet" to --set--.

Col. 5, line 19, change "AlSi" to --Al-Si--.

Signed and Sealed this

Fourteenth Day of November, 1989

Attest:

JEFFREY M. SAMUELS

Attesting Officer     Acting Commissioner of Patents and Trademarks